US008907716B2

(12) United States Patent
Zhu et al.

(10) Patent No.: US 8,907,716 B2
(45) Date of Patent: Dec. 9, 2014

(54) SYSTEMS AND METHODS FOR CONTROL OF POWER SEMICONDUCTOR DEVICES

(71) Applicant: General Electric Company, Schenectady, NY (US)

(72) Inventors: Jun Zhu, ShangHai (CN); Robert Gregory Wagoner, Salem, VA (US); Huibin Zhu, Westford, MA (US); Chengjun Wang, ShangHai (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/767,641

(22) Filed: Feb. 14, 2013

(65) Prior Publication Data

US 2014/0184308 A1 Jul. 3, 2014

(51) Int. Cl.
*H03K 17/687* (2006.01)
*H03K 17/56* (2006.01)

(52) U.S. Cl.
CPC ..................................... *H03K 17/56* (2013.01)
USPC ......................................... 327/419; 327/427

(58) Field of Classification Search
CPC ... H03K 17/302; H03K 17/60; H03K 17/601; B60Q 1/382; G05D 23/241
USPC ........... 327/419, 421, 427, 434, 172; 323/311
See application file for complete search history.

(56) References Cited

U.S. PATENT DOCUMENTS

| | | | |
|---|---|---|---|
| 4,697,205 A | 9/1987 | Eastman | |
| 4,833,567 A | 5/1989 | Saaski et al. | |
| 4,880,052 A | 11/1989 | Meyer, IV et al. | |
| 6,926,072 B2 | 8/2005 | Wert | |
| 7,111,394 B2 | 9/2006 | Wert | |
| 7,796,389 B2 | 9/2010 | Edmunds et al. | |
| 2012/0025875 A1* | 2/2012 | Fukuta et al. | 327/109 |

FOREIGN PATENT DOCUMENTS

| | | |
|---|---|---|
| CN | 102055364 A | 5/2011 |
| CN | 102237672 A | 11/2011 |
| EP | 1988633 A1 | 11/2008 |

OTHER PUBLICATIONS

International search report and written opinion issued in corresponding WP Application No. PCT/CN2012/087758, Oct. 17, 2013.
U.S. Appl. No. 13/549,371, filed Jul. 13, 2012, Wagoner et al.
Park et al., Flexible dv/dt and di/dt Control Method for Insulated Gate Power Switches, IEEE Transactions on Industry Applications, vol. 39, No. 3, May/Jun. 2003.
Lefranc et al., State of the Art of dv/dt and di/dt Control of Insulated Gate Power Switches, Proceedings of the Conference Captech IAP1, Power Supply and Energy Management for Defence Applications, 2007, Bruxelles, Belgium.

\* cited by examiner

*Primary Examiner* — Diana J Cheng

(57) ABSTRACT

A device includes a controller configured to regulate one or more voltages applied to a gate of an insulated gate bipolar transistor (IGBT). The controller is configured to receive one or more voltage values associated with the IGBT, and generate a gating signal and transmit the gating signal to the IGBT. The gating signal is configured to activate or deactivate the IGBT. The controller is configured to generate a voltage clamping signal and transmit the voltage clamping signal to activate or deactivate an active switching device. The active switching device is configured to periodically limit the one or more voltage values associated with the IGBT based at least in part on one or more characteristics of the voltage clamping signal.

20 Claims, 2 Drawing Sheets

US 8,907,716 B2

SYSTEMS AND METHODS FOR CONTROL OF POWER SEMICONDUCTOR DEVICES

CROSS-REFERENCE TO RELATED APPLICATIONS

The present application claims benefit of priority to International Patent Application No. PCT/CN2012/087758 entitled "Systems and Methods for Control of Power Semiconductor Devices," filed Dec. 28, 2012, the entirety of which is incorporated by reference herein for all purposes.

BACKGROUND OF THE INVENTION

The subject matter disclosed herein relates to power electronic devices and, more specifically, to dynamically activating and deactivating a voltage clamping power electronic device.

Energy generating devices, such as distributed generators (e.g., photovoltaic panels and wind turbines) rely on semiconductor switching devices (e.g., insulated gate bipolar transistors (IGBTs)) to perform various power conversion operations. To operate an IGBT, a pulsed voltage signal is provided to the gate of the IGBT via a gate driver circuit or controller. Active voltage clamping is often used to protect IGBTs from electrical damage, as IGBTs may be susceptible to high peak voltage while the IGBT is switched off or deactivated. Specifically, if the voltage at the collector of the IGBT exceeds a clamping voltage threshold, the clamping circuitry may be switched on or activated. Unfortunately, because the clamping voltage threshold is typically much lower than the maximum voltage rating of the IGBT, the clamping circuitry may limit the maximum operating voltage range of the IGBT.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a one embodiment, a device includes a controller configured to regulate one or more voltages applied to a gate of an insulated gate bipolar transistor (IGBT). The controller is configured to receive one or more voltage values associated with the IGBT, and generate a pulse-width modulation gating signal and transmit the gating signal to the IGBT. The gating signal is configured to activate or deactivate the IGBT. The controller is configured to generate a voltage clamping signal and transmit the voltage clamping signal to activate or deactivate an active switching device. The active switching device is configured to periodically limit the one or more voltage values associated with the IGBT based at least in part on one or more characteristics of the voltage clamping signal.

In a second embodiment, a non-transitory computer-readable medium includes code with instructions to receive one or more voltage values associated with an IGBT, and generate a gating signal and transmit the gating signal to the IGBT. The gating signal is configured to activate or deactivate the IGBT. The non-transitory computer-readable medium includes code with instructions to generate a voltage clamping signal and transmit the voltage clamping signal to activate or deactivate an active switching device. The active switching device is configured to periodically limit the one or more voltage values associated with the IGBT based at least in part on one or more characteristics of the voltage clamping signal.

In a third embodiment, a device includes an insulated gate bipolar transistor (IGBT) configured to receive a gating signal as an indication to active or deactivate, a zener diode configured to activate at a predetermined clamping voltage threshold value, and an active switching device communicatively coupled to the IGBT and the zener diode. The active switching device is configured to limit one or more voltages associated with the IGBT to the clamping voltage threshold value when activated and to allow the one or more voltages associated with the IGBT to exceed the clamping voltage threshold value when deactivated.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Present embodiments relate to dynamically activating and deactivating voltage clamping circuitry used to protect IGBTs from electrical damage during the period of time the IGBT is switched off. The dynamic voltage clamping circuitry may also allow the voltage of the IGBT to periodically rise above a predetermined clamping voltage threshold. More particularly, the present embodiments allow the IGBT to be operated at its maximum voltage rating to increase power conversion margins by periodically activating and deactivating the clamping circuitry.

Figure 1:
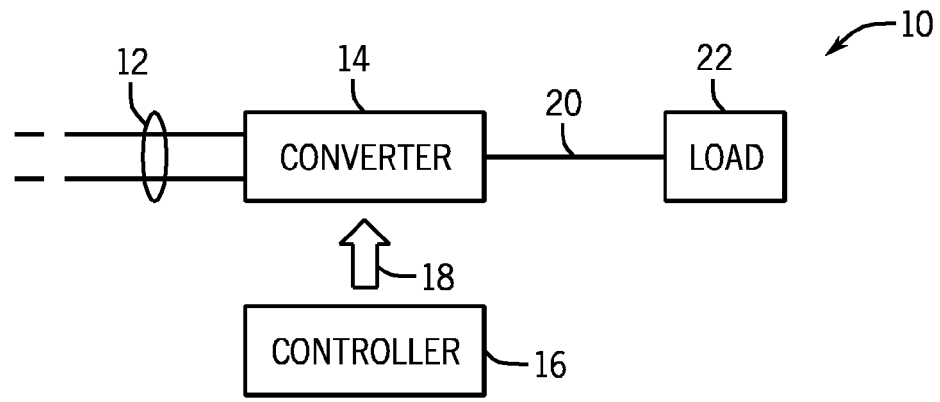
FIG. 1 is a block diagram of a power conversion and control system in accordance with present embodiments.

With the foregoing in mind, FIG. 1 is a block diagram of a power conversion and control system 10. The system 10 may include power conductors 12 (e.g., single or poly-phase), a power converter 14, a controller 16 communicatively coupled via a communications link 18 to the converter 14, and a load 22 communicatively coupled via a communications link 20 to the converter 14. In certain embodiments, the system 10 may be used as a starting converter, a continuous duty drive, or similar system for controlling the source of power, and by extension, for example, speed and torque provided to various industrial machinery such as the load 22. In the case that the system 10 is a starting converter, for example, the system 10 may function as a variable speed alternating current (AC) drive system that drives, for example, a synchronous motor (e.g., load 22).

In certain embodiments, the converter 14 may include a number of active power electronic switching devices such as silicon-controlled rectifiers (SCRs), thyristors, insulated gate bipolar transistors (IGBTs), and so forth, which may be used to switch to and from "ON" (e.g., activated and/or enabled) and "OFF" (e.g., deactivated and/or disabled) states to control the power flow to the load 22. For example, in the "OFF" state, the switching devices of converter 14 may restrict the flow of current to only a leakage current. Similarly, in the "ON" state, for example, the switching devices of converter 14 may conduct current when the input voltage exceeds a certain threshold voltage. Specifically, the converter 14 may be any electrical device(s) that transforms direct current (DC) electricity via a DC reactor link to alternating current (AC) electricity, or that transforms alternating current (AC) to electricity direct current (DC) electricity. As will be further appreciated, the converter 14 may include one or more IGBTs and a clamping circuit to clamp, or limit, the peak voltage of each of the IGBTs to a predetermined value during the time each of the IGBTs switches "OFF."

As previously discussed, the system 10 may also include the controller 16. The controller 16 may control the operation of the converter 14, and by extension, power flowing to the load 22. Accordingly, the controller 16 may include a processor that may be used in processing computer instructions, and a memory that may be used to store computer instructions and other data. These instructions may be encoded in programs stored in a tangible non-transitory computer-readable medium such as the memory and/or other storage. In certain embodiments, the controller 16 may control the conversion and/or inversion of AC or DC power received, for example, from one or more distributed generators (e.g., photovoltaic panels, wind turbines, and so forth) by sending switching signals to a number of switching devices, such as IGBTs, SCRs, thyristors, and so forth, that may be included in the converter 14. In such a case, the controller 18 may control the amount of current flowing from the distributed generators via the power conductors 12 to the load 22.

In one embodiment, the controller 16 may be a pulse width modulation (PWM) controller. Specifically, the controller 16 may include one or more functions of using digital pulse signals (e.g., AC or DC) to produce an output voltage (e.g., AC or DC) level for control of the converter 14. For example, the controller 16 may transmit an "ON"/"OFF" period PWM signal to the converter 14, in which the converter 14 may be controlled to switch "ON" when the PWM signal is logically high (i.e., at the rising edge of the PWM signal), and switch "OFF" when the PWM signal is logically low (i.e., at the falling edge of the PWM signal). Thus, the controller 16 may, by extension, control the output (e.g., speed and torque), for example, of the load 22. It should be appreciated that the converter 14 may include multiple IGBTs, and thus the controller 18 may transmit a separate PWM signal to each of the IGBTs to allow separate control of each of the IGBTs. As will be discussed in further detail below, the controller 16 may also include electrical clamping (i.e., restricting a voltage signal from exceeding a certain defined magnitude or set point) logic and/or firmware to dynamically control the clamping periods along with the PWM "ON"/"OFF" periods transmitted to the converter 14.

Figure 2:
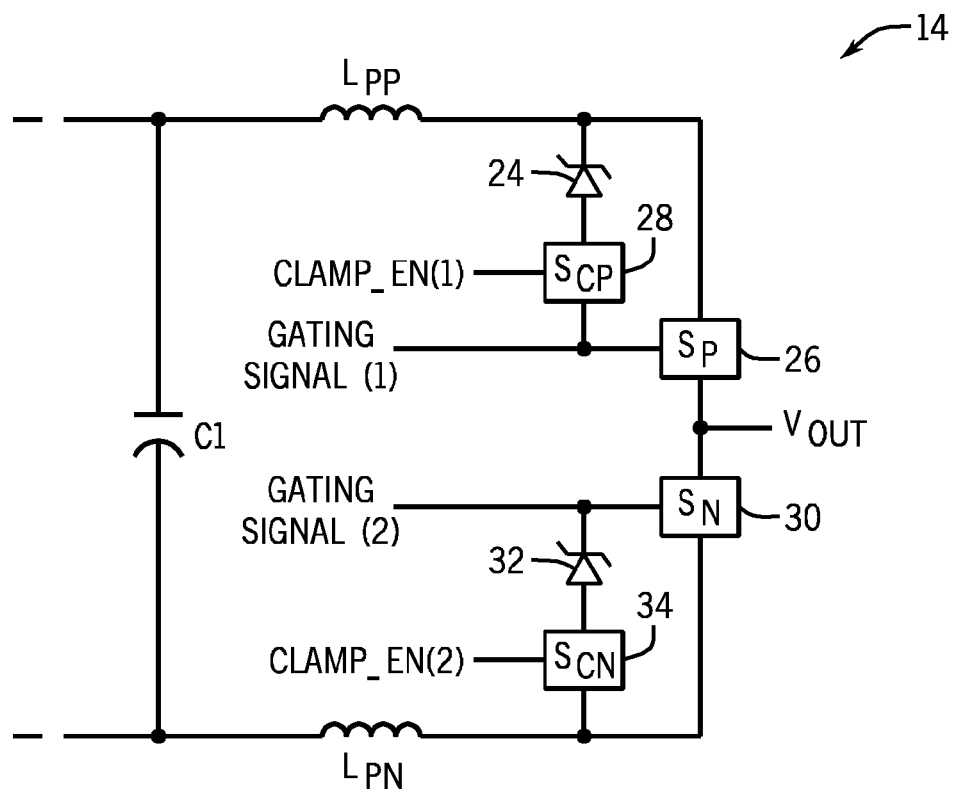
FIG. 2 depicts a schematic diagram of a series of active clamping circuits for insulated gate bipolar transistors (IGBTs), in accordance with an embodiment.

FIG. 2 is a schematic diagram of one embodiment of the converter 14 discussed above. The converter 14 may include various active clamping circuitry, which may be configured to dynamically clamp, for example, the upper and lower voltage (e.g., $V_{OUT}$) magnitudes of the converter 14. Specifically, the active clamping circuitry may control the voltage across IGBTs 26 (e.g., $S_P$) and 30 (e.g., $S_N$), and thus protect the IGBTs 26 and 30 from substantive electrical (e.g., overvoltage, overcurrent, and so forth) damage. Similarly, active electronic switching devices 28 (e.g., $S_{CP}$) and 34 (e.g., $S_{CN}$) along with zener diodes 24 and 32 may be configured to control and regulate the voltage of the IGBTs 26 and 30. For example, the converter 14 may be a DC-DC converter including the IGBTs 26 and 30 each rated to a certain maximum voltage (e.g., 1700V). Continuing, the converter 14 may include the zener diodes 24 and 32 each having a reverse breakdown voltage threshold (e.g., 1000, 1200, 1400V). Accordingly, the zener diodes 24 and 32 may each clamp, or limit, the voltage of the IGBTs 26 and 30 to the reverse breakdown voltage threshold (e.g., 1000, 1200, 1400V), respectively. As will be discussed in greater detail below, in certain embodiments, it may be desirable to operate each of the IGBTs 26 and 30 above the clamping or reverse breakdown voltage threshold (e.g., 1400V) of the zener diodes 24 and 32. In such a case, a clamping activation and/or deactivation signal (e.g., CLAMP_EN (1) and/or CLAMP_EN (2)) may be generated, for example, by the controller 16 to dynamically control each of the switching devices 28 and 34. That is, the controller 16 may control each of the switching devices 28 and 34 to switch "ON" and/or "OFF," and thus allow each of the IGBTs 26 and 30 to periodically operate at their respective maximum voltage rating (e.g., 1700V).

Figure 3:
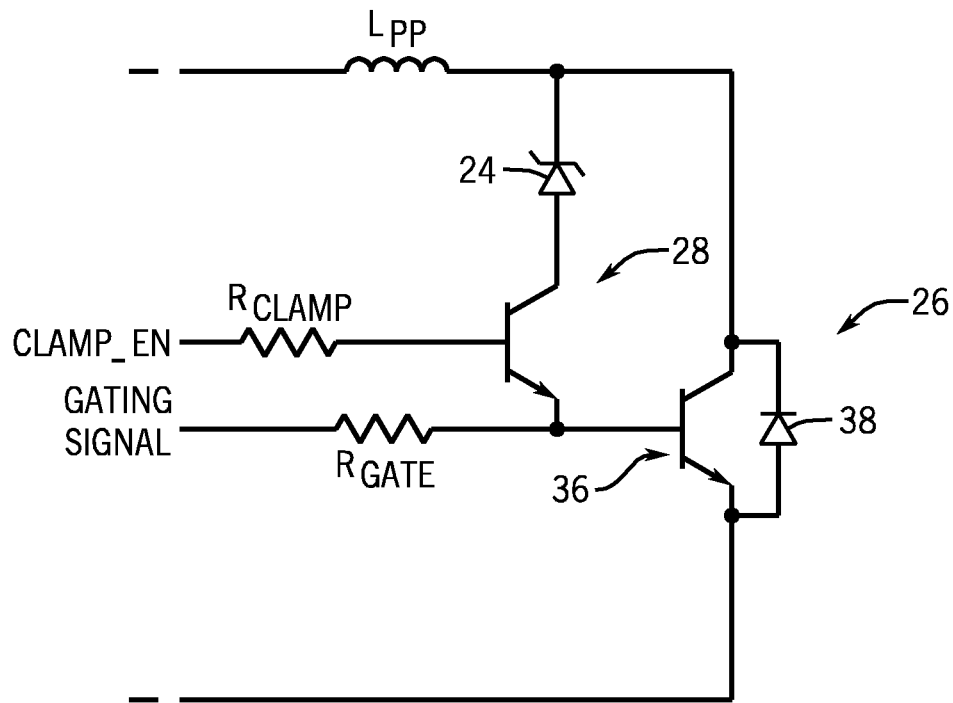
FIG. 3 depicts a schematic diagram of an active clamping circuit for an IGBT including gating and clamping circuitry, in accordance with an embodiment.

For example, as previously discussed, and as specifically depicted in FIG. 3, the active clamping circuitry may be used to protect the IGBT 26 from damage caused by a high peak voltage that may accumulate across the collector of the IGBT 26. As illustrated, the active clamping circuitry may include the IGBT 26, gating (e.g., GATING SIGNAL) and clamping (e.g., CLAMP_EN) control signals, gate resistors (e.g., $R_{CLAMP}$ and $R_{GATE}$), the zener diode 24, the active switching device 28, and a diode 38. As noted above with respect to FIG. 2, the switching device 28 may be configured to receive the clamping signal (e.g., CLAMP_EN) to turn "ON" and/or "OFF" to allow the IGBT 26, for example, to periodically operate at its maximum rated voltage (e.g., 1700V). Although referred to as a clamping signal, it should be appreciated that, in certain embodiments, the clamping signal (e.g., CLAMP_EN) may also be a PWM signal. The switching device 28 may be any active electronic device useful to switch, amplify, or convert incoming electrical signals. For example, in one embodiment, the switching device 28 may be an IGBT. Yet, in another embodiment, the switching device 28 may be a bipolar junction transistor (BJT), a metal-oxide-semiconductor field-effect transistor (MOSFET), or other similar active electronic device. In certain embodiments, the switching device 28 may exhibit a faster switching speed than that of the IGBT 26. Thus, the switching device 28 may be switched "ON" or "OFF" substantially instantaneously to detecting a characteristic (e.g., rising edge, falling edge, change in duty cycle, and so forth) of the clamping signal (e.g., CLAMP_EN).

In certain embodiments, the zener diode 24 may be connected in a reversed-bias configuration between the collector of the IGBT 26 and the collector of the switching device 28. Namely, if the voltage across the collector of the IGBT 26 exceeds the reverse breakdown voltage threshold (e.g., 1400V) of the zener diode 24, the zener diode 24 may turn "ON" (i.e., conduct current), and thus dissipate current (or power) that may have otherwise flowed into the gate 36 of the IGBT 26. Specifically, current flowing through the zener diode 24 from the collector of the IGBT 26 to the switching device 28 may increase the voltage on the gate 36 of the IGBT 26. This may, for example, cause the IGBT 26 to attempt to conduct a higher current than the maximum current rating of the IGBT 26. More particularly, when the IGBT 26 switches "OFF" (e.g., when the gating signal (GATING SIGNAL) is logically low), the voltage of the collector of the IGBT 26 may rise due to a parasitic inductance (e.g., $L_{PP}$) that may occur across the collector of the IGBT 26. Accordingly, the active clamping circuitry may effectively clamp the peak collector voltage to approximately the reverse breakdown voltage threshold (e.g., 1400V) of the zener diode 24.

As previously discussed, in certain embodiments, it may be desirable to operate the IGBT 26 above the clamping or reverse breakdown voltage threshold (e.g., 1400V) of the zener diode 24. For example, for an IGBT 26 having a maximum voltage rating of 1700V, it may be advantageous to drive the IGBT 26 to operate at the 1700V voltage rating to increase the power conversion margins. That is, instead of the voltage being clamped at the threshold voltage (e.g., 1400V) of the zener diode 24, the IGBT 26 may be allowed to operate at its maximum voltage rating in so long as that maximum voltage (e.g., 1700V) is not exceeded. In such a case, a clamping enable and/or disable signal (e.g., CLAMP_EN) may be generated by the controller 16 to control the switching device 28 and zener diode 24 (e.g., clamping circuitry) to turn "ON" and/or "OFF," and thus allow the IGBT 26 to periodically operate at the maximum voltage rating (e.g., 1700V).

Figure 4:
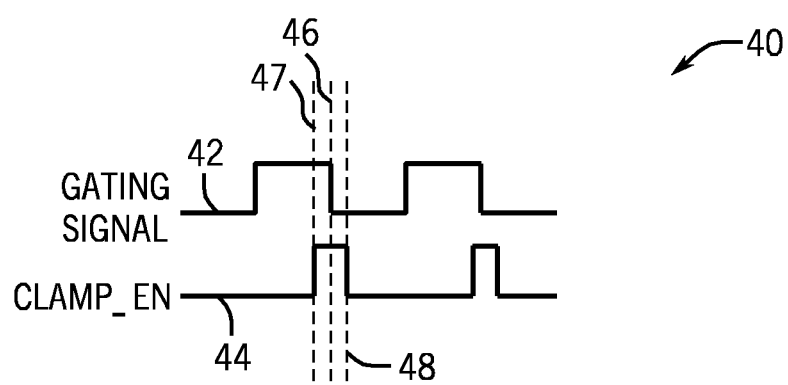
FIG. 4 depicts a timing diagram of embodiments of gating and clamping control signals, in accordance with an embodiment.

Turning now to FIG. 4, the techniques as discussed above may be better understood with respect to a gating signal 42 (GATING SIGNAL) and a voltage clamping signal 44 (CLAMP_EN). As also noted above, the signals 42 (GATING SIGNAL) and 44 (CLAMP_EN) may be PWM signals generated by the controller 16, which may include a processor that may execute instructions for carrying out presently disclosed methods. These instructions may be encoded in programs stored in a tangible non-transitory computer-readable medium such as a memory and/or other storage of the controller 16. In certain embodiments, the controller 16 may be referred to as a gate driver, since the controller 16 may transmit the gating signal 42 (GATING SIGNAL) to the IGBT 26. In particular, the IGBT 26 may be controlled to switch "ON" when the gating signal 42 (GATING SIGNAL) is logically high, and switch "OFF" when the gating signal is logically low. Similarly, the clamping signal 44 (CLAMP_EN) may be generated by the controller 16 to control the switching device 28 and zener diode 24 to dynamically switch "ON" and/or "OFF." Accordingly, the controller 16 may control when the voltage of the IGBT 26 is to be clamped, as opposed to allowing the zener diode 24 to clamp the voltage of the IGBT 26 in every instance the clamping voltage threshold is exceeded.

As depicted in FIG. 4, the clamping signal 44 (CLAMP_EN) may become logically high at substantially the same point in time that the gating signal 42 (GATING SIGNAL) is logically high. In other embodiments, the clamping signal 44 (CLAMP_EN) may become logically high after period of time following the gating signal 42 (GATING SIGNAL) becoming logically high. That is, the clamping signal 44 (CLAMP_EN) may become logically high at a point in time 47 just before, or just after the gating signal 42 (GATING SIGNAL) becomes logically high. Thus, over the duty cycle (i.e., the percentage of time the gating signal 42 and the clamping signal 44 are each logically high during a pulse period) of the gating signal 42 (GATING SIGNAL), the voltage of the IGBT 26 is clamped to the clamping voltage threshold of the zener diode 24. However, as previously discussed, the voltage across the collector of the IGBT 26 may rise during "switch OFF," or the period in which the gating signal 42 (GATING SIGNAL) is logically low. Accordingly, a delay may be introduced between the time the gating signal 42 (GATING SIGNAL) becomes logically low (at the falling edge 46) and the time the clamping signal 44 (CLAMP_EN) becomes logically low (e.g., at the falling edge 48). As such, during the delay period (i.e., substantially the time it takes the IGBT 26 to completely switch "OFF") between signals 42 and 44 becoming logically low, the voltage of the IGBT 26 may be clamped to the clamping voltage threshold of the zener diode 24, and thus protected from potential damage or failure due to overvoltage and/or overcurrent heating. In one embodiment, the delay period may be approximately 1-10 microseconds.

As previously noted, in certain embodiments, statically clamping the peak voltage of the IGBT 26 may present an undesirable effect. Namely, as long as the peak voltage is above the clamping voltage threshold, the zener diode 24 (e.g., clamping circuitry) will be "ON," even though the IGBT 26 may be periodically switched "OFF." Since the clamping voltage threshold (e.g., 1400V) may be, in many instances, lower than the maximum voltage rating of the IGBT 26, the switching device 28 and zener diode 24 may actually limit the peak voltage of the IGBT 26 to a margin much lower than the maximum voltage rating of the IGBT 26. Accordingly, the clamping signal 44 (e.g., CLAMP_EN) generated by the controller 16 and transmitted to the switching device 28 may be pulsed or modulated, such that the voltage across the IGBT 26 can rise above the clamping voltage threshold of the zener diode 24 when the IGBT 26 is periodically switched "OFF." For example, should the maximum voltage rating of the IGBT 26 be approximately 1700V and the clamping voltage threshold be approximately 1400V, during the period the clamping signal 44 (e.g., CLAMP_EN) is logically low, and by extension, the switching device 28 switches "OFF," the IGBT 26 may be operated more closely to its maximum voltage rating of 1700V. Thus, as long as the voltage across the collector of the IGBT 26 does not exceed its maximum voltage rating (e.g., 1700V), the IGBT 26 may be operated at the maximum voltage rating to increase the power conversion and operating margins of the IGBT 26.

Technical effects of present embodiments relate to active and dynamic voltage clamping to protect IGBTs from electrical damage. Particularly, an active switching device is provided to clamp the voltage of the IGBT during the period of time the IGBT is switched off. However, the active switching device may also allow the voltage of the IGBT to periodically rise above the clamping voltage threshold. More particularly, the present embodiments allow the IGBT to be operated at its maximum voltage rating to increase power conversion margins by periodically deactivating the clamping circuitry.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A device, comprising:
a controller configured to regulate one or more voltages applied to a gate of an insulated gate bipolar transistor (IGBT) configured to:
generate a gating signal and transmit the gating signal to the IGBT,
wherein the gating signal is configured to activate or deactivate the IGBT; and
generate a voltage clamping signal and transmit the voltage clamping signal to activate or deactivate a transistor, wherein a terminal of the transistor is directly coupled to a gate of the IGBT, and wherein the transistor is configured to periodically limit a peak operational voltage value of the IGBT based at least in part on one or more characteristics of the voltage clamping signal, and wherein the peak operational voltage value is greater than a voltage of the gating signal.

2. The device of claim 1, wherein the controller is configured to limit the peak operational voltage value of the IGBT to a clamping voltage threshold.

3. The device of claim 2, wherein the clamping voltage threshold is less than a maximum voltage rating of the IGBT.

4. The device of claim 1, wherein the controller is configured to generate and transmit logically high portions of the gating signal and generate and transmit logically high portions of the voltage clamping signal at substantially the same point in time.

5. The device of claim 4, wherein the logically high portions of the gating signal return logically low at a first point in time and the logically high portions of the voltage clamping signal return logically low at a second point in time, wherein the second point in time is delayed until after the first point in time.

6. The device of claim 5, wherein the delay of the second point in time is substantially the time taken for the IGBT to completely deactivate, and wherein the one or more voltage values associated with the IGBT is limited to a clamping voltage threshold between the first point in time and the second point in time.

7. The device of claim 5, wherein the delay of the second point in time is approximately 10 microseconds or less.

8. The device of claim 1, wherein the controller is configured to activate the transistor to limit the peak operational voltage value of the IGBT to a clamping voltage threshold, and deactivate the transistor to allow the peak operational voltage value of the IGBT to exceed the clamping voltage threshold.

9. The device of claim 8, wherein the transistor is configured to deactivate in less time than the IGBT is configured to deactivate.

10. The device of claim 8, wherein allowing the peak operational voltage value of the IGBT to exceed the clamping voltage threshold comprises operating the IGBT at a maximum voltage rating for a period of time.

11. The device of claim 10, wherein operating the IGBT at the maximum voltage rating for the period of time comprises increasing the operating margin of the IGBT.

12. A non-transitory computer-readable medium having computer executable code stored thereon, the code comprising instructions to:
generate a gating signal and transmit the gating signal to an insulated gate bipolar transistor (IGBT), wherein the gating signal is configured to activate or deactivate the IGBT; and
generate a voltage clamping signal and transmit the voltage clamping signal to activate or deactivate a transistor, wherein a terminal of the transistor is directly coupled to a gate of the IGBT, and wherein the transistor is configured to periodically limit a peak operational voltage value of the IGBT based at least in part on one or more characteristics of the voltage clamping signal, and wherein the peak operational voltage value is greater than a voltage of the gating signal.

13. The non-transitory computer-readable medium of claim 12, wherein the code comprises instructions to generate and transmit logically high portions of the gating signal and generate and transmit logically high portions of the voltage clamping signal at substantially the same point in time.

14. The non-transitory computer-readable medium of claim 13, wherein the code comprises instructions to return the logically high portions of the gating signal logically low at a first point in time, and return the logically high portions of the voltage clamping signal logically low at a second point in time, wherein the second point in time is delayed until after the first point in time.

15. The non-transitory computer-readable medium of claim 12, wherein the code comprises instructions to activate the transistor to limit the peak operational voltage value of the IGBT to a clamping voltage threshold, and deactivate the transistor to allow the peak operational voltage value of the IGBT to exceed the clamping voltage threshold.

16. The non-transitory computer-readable medium of claim 15, wherein the code comprises instructions to operate the IGBT at a maximum voltage rating for a period of time to increase the operating margin of the IGBT.

17. A device, comprising:
an insulated gate bipolar transistor (IGBT) configured to receive a gating signal as an indication to active or deactivate;
a zener diode configured to activate at a clamping voltage threshold value; and
an active switching device coupled to the IGBT and the zener diode, wherein the active switching device and the zener diode are coupled between a collector portion and a gate portion of the IGBT, and wherein the active switching device is configured to limit one or more voltages associated with the IGBT to the clamping voltage threshold value when activated, and to allow the one or more voltages associated with the IGBT to exceed the clamping voltage threshold value when deactivated.

18. The device of claim 17, wherein the active switching device comprises a transistor configured to deactivate in less time than the IGBT is configured to deactivate.

19. The device of claim 17, wherein the active switching device is configured to limit the one or more voltages associated with the IGBT to the clamping voltage threshold upon detecting a rising edge portion of a received voltage clamping signal, and to allow the one or more voltages associated with the IGBT to exceed the clamping voltage threshold upon detecting a falling edge portion of the received voltage clamping signal.

20. The device of claim 17, wherein the active switching device is configured to allow the one or more voltages associated with the IGBT to exceed the clamping voltage threshold value by deactivating the zener diode.

* * * * *